United States Patent [19]

Masuda et al.

[11] 4,352,092
[45] Sep. 28, 1982

[54] DIGITAL TO ANALOG CONVERTER

[75] Inventors: Eiji Masuda; Hiroshi Kawasaki, both of Kawasaki, Japan

[73] Assignee: Tokyo Shibaura Denki Kabushiki Kaisha, Japan

[21] Appl. No.: 197,949

[22] Filed: Oct. 17, 1980

[30] Foreign Application Priority Data

Oct. 22, 1979 [JP] Japan .................................. 54-136252

[51] Int. Cl.³ .......................................... H03K 13/02
[52] U.S. Cl. .......................................... 340/347 DA
[58] Field of Search ................ 340/347 AD, 347 DA, 340/347 M

[56] References Cited

U.S. PATENT DOCUMENTS 3,984,830  10/1976  Buchanan ................... 340/347 DA
4,160,244   7/1979  Solomon ..................... 340/347 DA
4,196,420   4/1980  Culmer ....................... 340/347 DA

FOREIGN PATENT DOCUMENTS 52-28851  3/1977  Japan .

OTHER PUBLICATIONS

Hamade, "IEEE Journal of Solid-State Circuits", vol. SC-13, No. 6, Dec. 1978, pp. 785-791.

Primary Examiner—Charles D. Miller
Attorney, Agent, or Firm—Finnegan, Henderson, Farabow, Garrett and Dunner

[57]  ABSTRACT

A digital to analog converter is provided which comprises first and second reference voltage terminals to which are supplied positive voltages, a voltage divider which comprises a plurality of resistors connected in series between the first and second reference voltage terminals, and a switch array part connected to the voltage divider for producing a voltage according to the digital signal supplied to the gate terminals. The switch array part comprises CMOS field effect transistor circuits in which the first channel MOS field effect transistors are arranged at one side of the voltage divider, the second channel MOS field effect transistors are arranged at the other side of it, and the wirings of both channel field effect transistors cross the voltage driver with electrically insulated form from the voltage divider. The p-type well region as the back gate of the NMOS field effect transistor is connected to the reference voltage terminal to which a lower positive voltage is supplied.

10 Claims, 4 Drawing Figures

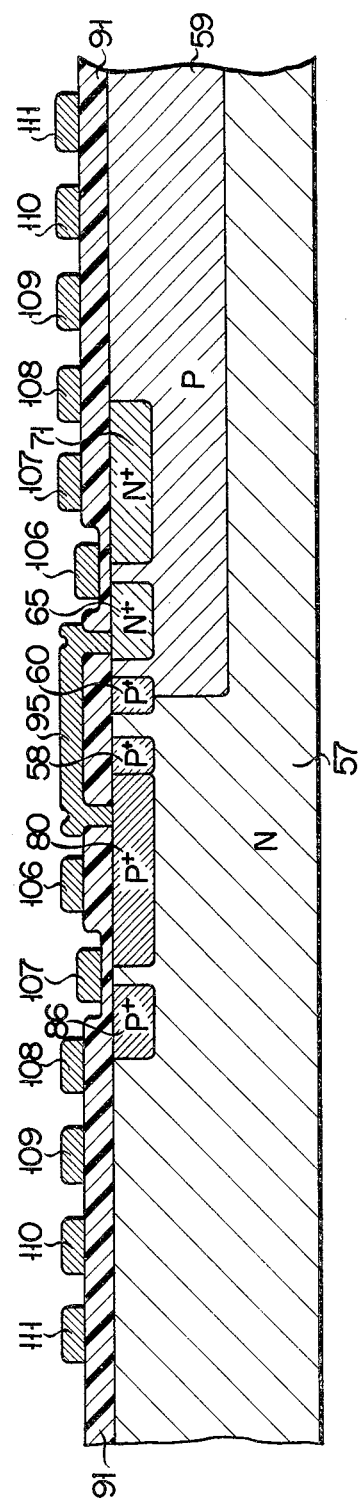

DIGITAL TO ANALOG CONVERTER

BACKGROUND OF THE INVENTION

The present invention relates to a digital to analog converter (D/A converter) suitable for a complementary metal oxide semiconductor (CMOS) integrated circuit.

A D/A converter has been proposed which comprises a voltage dividing part having a plurality of resistors connected in series between two reference voltage terminals, and a switch array comprising a plurality of switching elements of 2 inputs and 1 output connected between the voltage dividing points of the voltage dividing part and the output terminals, each switching element producing one input voltage according to a supplied digital signal so that a voltage across one voltage dividing point according to the supplied digital signal may be produced. Various semiconductor devices have recently become integrated and D/A converters of the type having this construction are also required to be integrated on a single semiconductor chip. Since many of the semiconductor integrated circuits are CMOS circuits, it is preferable that the switch array part of the D/A converter is constituted by CMOS transmission gates. The transmission gate preferably comprises a CMOS since a MOS transmission gate of a single channel cannot provide a wide range of voltages to be transmitted.

The CMOS transmission gate comprises p-type channel MOSFET (PMOSFET) and n-type channel MOSFET (NMOSFET) connected in parallel between input and output terminals. Digital control signals CS and their corresponding inverted signal $\overline{CS}$ are supplied to the gates of the respective MOSFETs for simultaneously rendering both MOSFETs conductive or nonconductive for controlling the transmission of voltage from the input terminals to the output terminals. The CMOS transmission gate is defective in that its area on the chip is greater than in the case of an MOS transmission gate of a single channel. A chip of general size (3–5 mm on a side) may not be satisfactorily used for a CMOS D/A converter of, for example, over 5 bits, resulting in higher cost.

The back gate of the NMOSFET is grounded when the CMOS transmission gate is formed on an n-type substrate, and the back gate of the PMOSFET is connected to the power source voltage so that the resistance between the source and drain of the MOSFETs constituting the CMOS transmission gate, that is, the ON resistance, is dependent on the input voltage. The back gate biasing effect of the CMOSFET circuit becomes significant especially when the input voltage is half the power source voltage, and the ON resistance becomes very high. Consequently, the response time becomes long and the operation of the D/A converter may not be of high speed, resulting in inconvenience.

SUMMARY OF THE INVENTION

It is, therefore, the object of the present invention to provide a digital to analog converter using CMOS transmission gates wherein the increase in the chip area and the decrease in the response speed due to back biasing effects are eliminated.

In order to achieve this object, the present invention provides a digital to analog converter comprising:
a power source terminal;
first and second reference voltage terminals;
voltage dividing means connected to said first and second reference voltage terminals and having a plurality of voltage dividing points; and
switch array means which is connected to said voltage dividing means and which is formed of a plurality of switching elements each having two CMOS field effect transistor circuits each including a first channel MOS field effect transistor and a second channel MOS field effect transistor whose source and drain are respectively connected to the source and drain of said first channel MOS field effect transistor, each of the output terminals of the current paths of the CMOS field effect transistor circuits of said switching elements being commonly connected, and each of said switching elements being so connected that the voltage across one voltage dividing point of said voltage dividing means is transmitted to the output terminals of one of said switching elements in response to control signals supplied to gates of said MOS field effect transistors.

BRIEF DESCRIPTION OF THE DRAWINGS

FIGS. 3 and 4 are sectional views along the lines III—III and IV—IV of FIG. 2, respectively.

DETAILED DESCRIPTION OF THE PREFERRED EMBODIMENT

Figure 1:
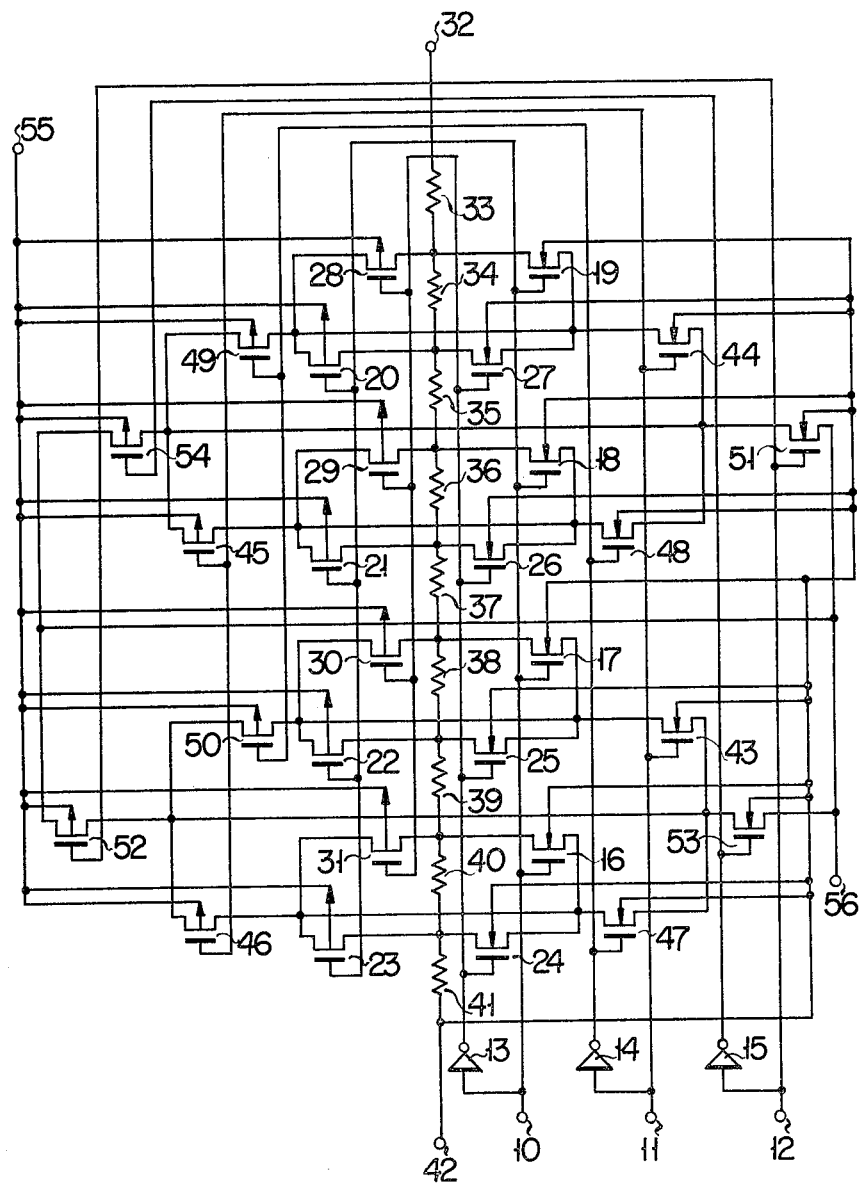
FIG. 1 is a circuit diagram of a D/A converter in accordance with one embodiment of the present invention.

A D/A converter in accordance with one embodiment of the present invention will be described with reference to the accompanying drawings. FIG. 1 shows its circuit diagram. This embodiment is applied to a D/A converter of 3 bits. Digital signal input terminals 10, 11 and 12 are connected to the input terminals of inverters 13, 14 and 15, respectively. The input terminal 10 corresponds to the least significant digit bit, and the input terminal 12 corresponds to the most significant digit bit. The input terminal 10 is connected to the gates of NMOSFETs 16, 17, 18 and 19 and to the gates of PMOSFETs 20, 21, 22 and 23. The output terminal of the inverter 13 is connected to the gates of NMOSFETs 24, 25, 26 and 27 and to the gates of PMOSFETs 28, 29, 30 and 31. A first reference voltage terminal 32 of higher positive voltage is connected to a second reference voltage terminal 42 of lower positive voltage through series connected voltage dividing resistors 33, 34, 35, 36, 37, 38, 39, 40 and 41. In this embodiment, the first reference voltage terminal 32 is at 3 V and the second reference voltage terminal 42 is at 2 V. The resistance of each of the resistors 34 through 40 is R, and the resistance of each of the resistors 33 and 41 is R/2. The value of R is 100 ohms to several kilo ohms. The sources of the NMOSFETs 16, 17, 18 and 19 are connected to the connection point of the resistors 39 and 40, that of the resistors 37 and 38, that of the resistors 35 and 36, and that of the resistors 33 and 34, respectively, and are also connected to the sources of the PMOSFETs 31, 30, 29 and 28, respectively. The drain of the NMOSFET 16 is connected to the drains of the NMOSFET 24 and the PMOSFETs 23 and 31. The drain of the NMOSFET 17 is connected to the drains of the NMOSFET 25 and the PMOSFETs 22 and 30. The drain of the NMOSFET 18 is connected to the drains of the NMOSFET 26 and the PMOSFETs 21 and 29. The drain of the NMOSFET 19 is connected to the drains of the NMOSFET 27 and the PMOSFETs 20 and 28. The sources of the NMOSFETs 24, 25, 26 and 27 are connected to the connection point of the resistors 40 and 41, that of the resistors 38 and 39, that of the resistors 36 and 37, and that of the resistors 34 and 35, respectively, and are also connected to the sources of the PMOSFETs 23, 22, 21, and 20, respectively. Thus, the NMOSFETs 16, 17, 18, 19, 24, 25, 26 and 27 and the PMOSFETs 31, 30, 29, 28, 23, 22, 21 and 20, respectively, constitute the first stage CMOS transmission gates, and the output terminals of these gates are connected in pairs.

The input terminal 11 is connected to the gates of NMOSFETs 43 and 44 and PMOSFETs 45 and 46. The output terminal of the inverter 14 is connected to the gates of NMOSFETs 47 and 48 and PMOSFETs 49 and 50. The sources of the NMOSFETs 47, 43, 48 and 44 are connected to the drains of the NMOSFETs 16 through 19, respectively. The sources of the PMOSFETs 49, 45, 50 and 46 are connected to the drains of the PMOSFETs 20 through 23, respectively. The drain of the NMOSFET 43 is connected to the drains of the NMOSFET 47 and the PMOSFETs 46 and 50. The drain of the NMOSFET 44 is connected to the drains of the NMOSFET 48 and the PMOSFETs 45 and 49. The NMOSFETs 43, 44, 47 and 48 and the PMOSFETs 50, 49, 46 and 45, respectively constitute the second stage CMOS transmission gates, and the output terminals of these gates are connected in pairs.

The input terminal 12 is connected to the gates of an NMOSFET 51 and a PMOSFET 52, and the output terminal of the inverter 15 is connected to the gates of an NMOSFET 53 and a PMOSFET 54. The sources of the NMOSFETs 51 and 53 are connected to the drains of the NMOSFETs 44 and 43, respectively. The sources of the PMOSFETs 52 and 54 are connected to the drains of the PMOSFETs 50 and 49, respectively. The drain of the NMOSFET 51 is connected to the drains of the NMOSFET 53 and the PMOSFETs 52 and 54. The NMOSFETs 51 and 53, and the PMOSFETs 54 and 52, respectively constitute the third stage CMOS transmission gates, and the output terminals of these two gates are commonly connected. The CMOS transmission gates of each stage are thus connected in a tree-like manner.

The back gates of the NMOSFETs 16 through 19, 24 through 27, 43, 44, 47, 48, 51 and 53 are connected to the second reference voltage terminal 42. The back gates of the PMOSFETs 20 through 23, 28 through 31, 45, 46, 49, 50, 52 and 54 are connected to a power source terminal 55. A voltage of 5 V is supplied at the power source terminal 55. The output terminal of the final (third) stage CMOS transmission gates, that is, the drain of the NMOSFET 51 is connected to an analog signal output terminal 56. Although the sources of the MOSFETs are connected to the voltage dividing points of the voltage dividing resistors in the above description, the drains may alternatively be connected. The resistances of the voltage dividing resistors 34 through 40 need not be the same.

The mode of operation of the D/A converter in accordance with this embodiment of the present invention will now be described. Since the input terminal 10 is directly connected to half of the first stage CMOS transmission gates and it is connected through the inverter 13 to the other half, half of the first stage CMOS transmission gates are rendered conductive by a digital signal supplied to the input terminal 10. Thus, the higher or the lower of the two terminal voltages of each of the resistors 34, 36, 38 and 40 are transmitted to the respective output terminals of the first stage CMOS transmission gates, for example, the drains of the NMOSFETs 19, 18, 17 and 16. When a signal of high (H) level is supplied to the gates, the NMOSFETs are rendered conductive and PMOSFETs are cut off. When a signal of low (L) level is supplied to the gates, NMOSFETs are cut off and PMOSFETs are rendered conductive. Assume that a signal of high (H) level is supplied to the input terminal 10. Thus, since the NMOSFETs 16 through 19 and the PMOSFETs 28 through 31 are rendered conductive, the terminals at higher voltage sides of the resistors 34, 36, 38 and 40, i.e., the voltages across the connection point of the resistors 33 and 34, that of the resistors 35 and 36, that of the resistors 37 and 38, and that of the resistors 39 and 40 are connected to the drains of the NMOSFETs 19, 18, 17 and 16, respectively.

The input terminal 11 is directly connected to half of the second stage CMOS transmission gates and it is connected through the inverter 14 to the other half. The second stage CMOS transmission gates are rendered conductive by a digital signal supplied to the input terminal 11. For example, when a signal of H level is supplied to the input terminal 11, the NMOSFETs 43 and 44 and the PMOSFETs 49 and 50 are rendered conductive and the drain voltages of the NMOSFETs 17 and 19 are respectively transmitted to the output terminals of the second stage CMOS transmission gates, e.g., the drains of the NMOSFETs 43 and 44.

Similarly the input terminal 12 is directly connected to half of the third stage CMOS transmission gates and it is connected to the other half through the inverter 15. Thus, half of the third stage CMOS transmission gates are rendered conductive by a digital signal supplied to the input terminal 12. For example, when a signal of H level is supplied to the input terminal 12, the NMOSFET 51 and the PMOSFET 54 are rendered conductive and the drain voltage of the NMOSFET 44 is supplied to the output terminals of the third stage CMOS transmission gates, e.g., the drain of the NMOSFET 51. When signals of H level are supplied to the input terminals 12, 11 and 10 in the order named, the highest voltage among the voltages across the voltage dividing points of the voltage dividing resistors, i.e., the voltage across the connection point of the resistors 33 and 34, is obtained at the output terminal 56. The voltage dividing point which is connected to the output terminal 56 draws nearer to the second reference voltage point 42 every time the digital input signal becomes smaller by 1. When L level signals are supplied to the input terminals 10 through 12, the voltage at the connection point of the resistors 40 and 41 is obtained at the output terminal 56. Since the resistances of the resistors 34 through 40 are the same, the digital to analog conversion of 3 bits is thus accomplished.

Figure 2:
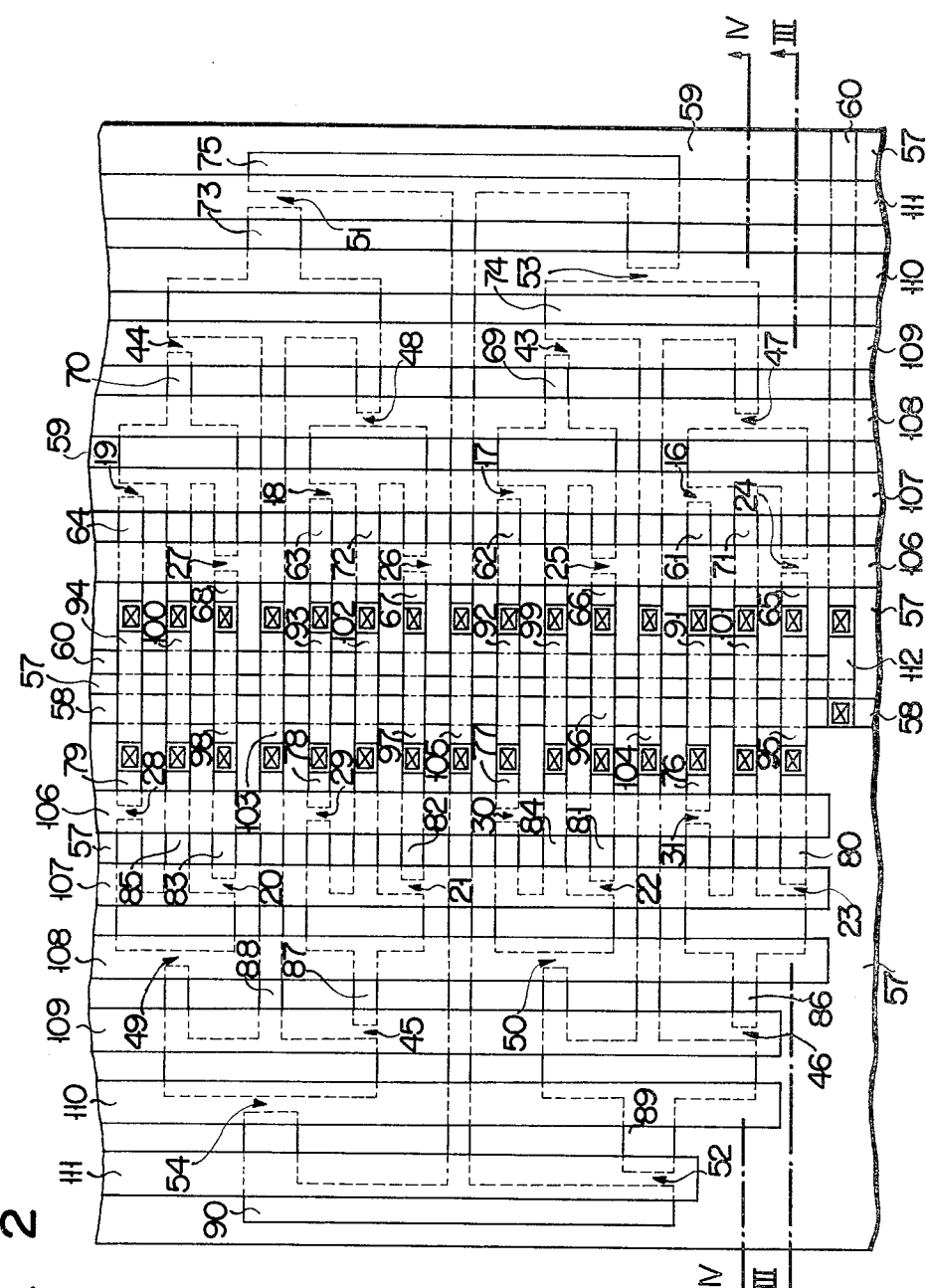
FIG. 2 is a plan view of an integrated circuit in accordance with this embodiment of the present invention.

The construction of the integrated circuit of this embodiment will now be described. FIG. 2 is a plan view illustrating the integrated pattern of the FETs and the resistors excluding the terminals and inverters of the above embodiment. FIGS. 3 and 4 are sectional views along the lines III—III and IV—IV of FIG. 2, respectively. The same parts are designated by the same reference numerals in FIGS. 1 through 4. A $p^+$-type semiconductor region 58 is formed in the surface area of the central portion of an n-type semiconductor substrate 57 to form a diffusion resistor. Both ends of the p+-type semiconductor region 58, although not shown, are connected to the first and second reference voltage terminals 32 and 42, respectively. A p-type semiconductor well region 59 as a substrate of NMOSFETs is formed at one side of the p+-type diffusion resistor 58 in the surface area of the n-type substrate 57. A p+-type semiconductor region 60 is formed in the surface area of the edge portion of the p-type well region 59.

Eight n+-type semiconductor regions 61 through 68 are formed as sources of the NMOSFETs 16, 17, 18, 19, 24, 25, 26, 27, respectively, in the surface area of the p-type well region 59 near the p+-type diffusion resistor 58. Four n+-type semiconductor regions 69 through 72 are formed as sources of the NMOSFETs 43, 44, 47 and 48, respectively, in the surface area of the p-type well region 59 outside the n+-type regions 61 through 68. The n+-type semiconductor region 69 also functions as the drains of the NMOSFETs 17 and 25. The n+-type regions 70, 71, and 72 also function as the drains of the NMOSFETs 19 and 27, 16 and 24, and 18 and 26, respectively. Two n+-type semiconductor regions 73 and 74 are formed as sources of the NMOSFETs 51 and 53, respectively, in the surface area of the p-type well region 59 outside the n+-type regions 69 through 72. The n+-type regions 73 and 74 also function as the drains of the NMOSFETs 44 and 48 and the drains of the NMOSFETs 43 and 47, respectively. An n+-type semiconductor region 75 is formed as the drains of the NMOSFETs 51 and 53 in the surface area of the p-type well region 59 outside the n+-type regions 73 and 74. The n+-type region 75 is connected to the output terminal 56, although it is not shown in the figure.

Fifteen p+-type semiconductor regions 76 through 90 are similarly formed as the sources of the PMOSFETs in the surface area of the n-type substrate 57 opposite the p-type well region 59 with the p+-type resistor 58 interposed therebetween. The p+-type semiconductor regions 76 through 83 as the sources of the PMOSFETs 20, 21, 22, 23, 28, 29, 30, 31, respectively, included in the first stage CMOS transmission gates are in contact with the p+-type diffusion resistor 58. As an example, a sectional view along the line III—III through the p+-type semiconductor region 80 is shown in FIG. 3. Other p+-type semiconductor regions 84 through 90 are not in contact with the p+-type diffusion resistor 58. As an example, a sectional view along the line IV—IV through the p+-type semiconductor region 86 is shown in FIG. 4. Although it is not shown in the pattern representation of FIG. 2, the surface of the semiconductor region is covered with a silicon oxide film.

The n+-type semiconductor regions 61 through 75 as the sources of the NMOSFETs and the p+-type semiconductor regions 76 through 90 as the sources of the PMOSFETs for forming the CMOS transmission gates are respectively connected with metal (aluminum) wirings 91 through 105 which cross with the p+-type resistor 58. The parts with cross marks in the figures are the parts where the semiconductor and the metal are in contact. The contact parts are formed at the part near the p+-type resistor region 58 at the center of the n-type substrate 57 for shortening the aluminum wirings. However, these aluminum wirings are separated from each other by the silicon oxide film 91. The sources of the respective MOSFETs of the first stage CMOS transmission gates are connected to the p+-type resistor 58 through the p+-type semiconductor region. The sources of the respective MOSFETs of the second and third stage CMOS transmission gates cross the p+-type resistor 58 but are not in contact therewith. In a D/A converter having a voltage dividing resistor having a plurality of voltage dividing points, and CMOS transmission gates which are connected to the voltage dividing resistor for connecting a voltage dividing point according to the digital signal supplied to the gates to the output terminal and which are mutually connected in a tree-like manner, the chip area may be utilized efficiently by arranging first channel MOSFETs at one side of the resistor and second channel MOSFETs at the other side of the resistor in a symmetrical manner, and crossing the connection wires of the corresponding FETs with the resistor under insulated conditions. Thus, a D/A converter using CMOS transmission gates is provided with substantially the same chip size as a D/A converter using single channel transmission gates.

Aluminum wirings 106 through 111 as the gates of the respective FETs are formed parallel to the p-type resistor 58. Although not shown in the figure, one end of each of the aluminum wirings 107, 109 and 111 are connected to the input terminals 10, 11 and 12, respectively, and one end of each of the aluminum wirings 106, 108 and 110 are connected to the output terminals of the inverters 13, 14 and 15, respectively. The p+-type semiconductor region 60 at the edge of the p-type well region 59 is connected to one end of the p+-type resistor region 58 near the second reference voltage terminal 42 with an aluminum wiring 112. Thus, the back gate of the NMOSFET is not at ground voltage but at the second reference voltage (2 V in this embodiment), and the resistance between the source and drain of the NMOSFET is reduced so that the generation of back gate biasing effects may be eliminated. Accordingly, the response time is shortened from when the digital input signal is switched until the predetermined voltage is obtained at the output terminal 56, so that the high speed operation of the D/A conversion is enabled.

Although the diffusion resistor region 58 is p+-type in the above description, it may be p- or p++-type. Further, the diffusion resistor 58 may be replaced with a polysilicon resistor. Although the p-type well region 59 is connected to the second reference voltage terminal 42, it may alternatively be connected to a part which has a potential up to about 0.7 V higher than the voltage potential at the second reference voltage terminal 42, or to a part with a potential which is lower than the second reference voltage but higher than the ground potential. Although the CMOS transmission gates are formed on the n-type substrate 57, the CMOS transmission gates may be formed on a p-type substrate. In this case, the well region is formed of an n-type semiconductor, and the n-type well region is connected to the first reference voltage terminal 32 of higher positive voltage or a part about the potential of this terminal.

What we claim is:
1. A circuit for converting a digital signal having N bits into an analog voltage having $2^N$ different values, comprising:
   N digital input terminals;
   an analog output terminal;
   a voltage divider having a pair of reference voltage terminals, voltage dividing elements, and $2^N$ voltage dividing points; and
   a switch array comprising N stages of CMOS FET circuits, with each circuit having a first channel

MOS FET whose back gate is connected to a power source terminal and a second channel MOS FET whose back gate is connected to said voltage divider and whose source and drain are connected, respectively, to the source and drain of the first channel MOS FET, each of said CMOS FET circuits having first and second terminals and having current paths interconnecting said first and second terminals, said switch array being adapted to connect one of said voltage dividing points of said voltage divider to said analog output terminal according to the level at said digital input terminals wherein the first terminals of the CMOS FET circuits of the first stage are connected respectively to the voltage dividing points of said voltage divider, the first terminals of each CMOS FET circuit of the Ith stage (I=2, 3, 4, ..., N) are connected to respective second terminals of MOS FET circuits of the (I−1)th stage, the second terminals of the CMOS FET circuits of the Nth stage are connected to the analog output terminal, and the control gates of all the CMOS FET circuits of each stage are connected to a corresponding digital input terminal.

2. The circuit according to claim 1, wherein said voltage dividing elements comprises a plurality of series connected resistors.

3. The circuit according to claim 1, in which the Jth digital input terminal (J=1, 2, ..., N), starting from the digital input terminal of the least significant bit, is connected to the control gates of the CMOS FET circuits of the Jth stage.

4. The circuit according to claim 1, in which the CMOS FET circuits of the same stage are divided into pairs with current paths of each of said pairs connected at the second terminals thereof to each other, and each digital input terminal is connected directly to the control gate of the first channel MOS FET of a first CMOS FET circuit of each pair and to the control gate of the second channel MOS FET of the second CMOS FET circuit of the pair and further connected through an inverter to the control gate of the second channel MOS FET of the first CMOS FET of the pair and to the control gate of the first channel MOS FET of the second CMOS FET circuit of the pair.

5. The circuit according to claim 4, in which the voltage at the voltage dividing point connected to the first CMOS FET circuit of any pair of the first stage is lower than the voltage at the voltage dividing point connected to the second CMOS FET circuit of said pair, and the voltage at the second terminals of the current paths of any pair of CMOS FET circuits of the (N−1)th stage which are connected to a first CMOS FET circuit of the Nth stage is lower than the voltage at the second terminals of the current paths of another pair of CMOS FET circuits of the (N−1)th stage which are connected to the second CMOS FET circuit of the Nth stage forming a pair with said first CMOS FET circuit of the Nth stage.

6. A digital to analog converter according to claim 5, wherein said first channel MOS FETs are arranged in a group at one side of said voltage divider, said second channel MOS FETs are arranged in a group at the other side of said voltage divider, and the drains of respective channel MOS FETs are connected by wirings crossing said voltage divider with said wires being electrically insulated from said voltage divider.

7. A digital to analog converter according to claim 1, comprising
a semiconductor substrate of a first conductivity type;
first semiconductor regions of a second conductivity type formed in an array formed in the surface area of the central portion of said semiconductor substrate and functioning as resistors;
a semiconductor well region of the second conductivity type formed in the surface area of said semiconductor substrate at one side of said first semiconductor region;
a plurality of second semiconductor regions of the first conductivity type formed in the surface area of said semiconductor well region and each forming said first channel MOS field effect transistor;
a plurality of third semiconductor regions of the second conductivity type formed in the surface area of said semiconductor substrate at the opposite side of said semiconductor well region with respect to said first semiconductor region and each forming said second channel MOS field effect transistor;
an insulation film formed on said semiconductor substrate, said semiconductor well region, and said first through third semiconductor regions;
a plurality of first wirings formed on said insulation film on said second and third semiconductor regions and functioning as the gates of said MOS field effect transistors;
a plurality of second wirings each connected to the sources of respective MOS field effect transistors in said second and third semiconductor regions and crossing over said insulation film on said first semiconductor region;
a plurality of third wirings each connected to the drains of respective MOS field effect transistors in said second and third semiconductor regions and crossing over said insulation film on said first semiconductor region; and
a fourth wiring connected to said first semiconductor region and said semiconductor well region.

8. A D/A converter according to claim 7, wherein parts of said third semiconductor region contact said first semiconductor region at mutually different positions for achieving connection of said second channel MOS field effect transistors and said resistors.

9. A digital to analog converter according to claim 7, wherein said second semiconductor regions comprise regions each functioning as the source of one of said first channel MOS field effect transistors and regions each functioning the drains of two of said first channel MOS field effect transistors and the source of one of said first channel MOS field effect transistors, and said third semiconductor regions comprise regions each functioning as the source of one of said second channel MOS field effect transistors and regions each functioning as the drains of two of said second channel MOS field effect transistors and the source of one of said second channel MOS field effect transistors.

10. A digital to analog converter according to claim 7, wherein said first wirings are parallel to said first semiconductor region and said second, third, and fourth wirings are perpendicular to said first semiconductor region.

* * * * *